HIGH-FREQUENCY TRANSISTOR OSCILLATOR

Filed April 26, 1949 2 Sheets-Sheet 1

INVENTOR
A. J. RACK
BY
Harry C. Hart
ATTORNEY $\phi = \pi + \omega\tau$
$\psi = 2n\pi - \phi$ $0 < \phi < 90°$
$0 > \psi > 90°$ $270° < \phi < 360°$
$90° > \psi > 0$ $\phi = \pi + \omega\tau$
$\omega\tau \doteq 180°$
$\psi = 2\pi - \phi \doteq 0$ $\phi = \omega\tau$
$\psi = 2n\pi - \phi$ $\phi = \omega\tau$
$\psi = 2n\pi - \phi$ $\phi = \omega\tau$
$\psi = 2n\pi - \phi$ INVENTOR
A. J. RACK
BY Harry C. Hart
ATTORNEY Patented June 12, 1951 2,556,296

UNITED STATES PATENT OFFICE 2,556,296

HIGH-FREQUENCY TRANSISTOR OSCILLATOR

Alois J. Rack, Millington, N. J., assignor to Bell Telephone Laboratories, Incorporated, New York, N. Y., a corporation of New York Application April 26, 1949, Serial No. 89,762

9 Claims. (Cl. 250—36)

This invention relates to the generation of oscillations with the aid of semiconductor amplifiers and to novel oscillation circuits therefor.

A principal object of the invention is to enable a semiconductor amplifier to be operated at higher frequencies than has heretofore been possible.

The invention utilizes as its central element a three electrode semiconductor amplifier of the type which forms a part of the subject-matter of United States Patent 2,524,035, which issued October 3, 1950, on an application of John Bardeen and W. H. Brattain, Serial No. 33,466, filed June 17, 1948, which is a continuation in part of an earlier application of the same inventors, Serial No. 11,165, filed February 26, 1948, and thereafter allowed to become abandoned. This central element comprises a small block of semiconductor material such as germanium having, in its original form, at least three electrodes electrically coupled thereto, which are termed the emitter, the collector and the base electrode. The emitter and the collector may be point contact electrodes making rectifier contact with the block, while the base electrode may be a plated metal film providing a low resistance contact with the block. The emitter may be biased for conduction in the forward direction, and in this condition its impedance is a few hundred ohms. On the other hand, the collector is biased for conduction in the reverse direction, in which case its impedance is several thousand ohms. The forward emitter bias results in the injection of charges into the block through the comparatively low emitter impedance and these charges are transported under the influence of electric fields within the block to the collector, where they are withdrawn through the comparatively high collector impedance. The application of a signal current or voltage to the emitter results in a variation of the injected charges and so of the charges transported to the collector. The high ratio of the collector impedance to the emitter impedance results in voltage amplification. In addition, the transported charges serve to modify the current flowing from the base to the collector so that current amplification results as well. Due to either or both phenomena, amplified versions of the voltage, current and power of the original signal appear in the load.

The device, which may take various forms, has received the appellation "Transistor," and will be so designated in the present specification.

It is pointed out in the aforementioned Bardeen-Brattain patent that, by feeding back a portion of the output voltage in proper phase to the input terminals, the device may be caused to oscillate at a frequency determined by the external circuit elements, and those applications disclose a self-oscillation circuit in which the collector as output terminal is coupled back to the emitter as input terminal for the maintenance of such oscillations. When there is current amplification, self-oscillations have also been maintained by virtue of current amplification as described, for example, in an application of H. L. Barney, Serial No. 67,159, filed December 24, 1948, and in an application of R. L. Hanson, Serial No. 67,937, filed December 29, 1948.

The characteristics of the transistor, however, differ widely from those of the more conventional vacuum tube triode. One important difference between the transistor and the conventional negative grid triode is that, whereas in the case of the vacuum tube the grid draws substantially no current at low frequencies, in the case of the transistor all three of the principal electrodes draw current. Still more significant is the fact that the signal frequency collector current may and usually does exceed the signal frequency emitter current, i. e., the device furnishes current amplification as well as voltage amplification. It is believed that this phenomenon occurs by virtue of the fact that the mobile charges transported from the emitter to the collector serve to modify the current flowing from the base to the collector, thus giving rise to current amplification.

At the same time it is to be noted that when the base electrode is grounded, the collector voltage is in phase with the emitter voltage, while when the emitter is grounded the collector voltage is in phase opposition to the emitter voltage. Especially when current amplification is present, this makes possible the construction of various new oscillator circuits of novel configuration. Thus, for example, in the above-mentioned application of R. L. Hanson, there is described an oscillator comprising a transistor of grounded base configuration in which the collector as output electrode is coupled back to the emitter as input electrode by way of a series resonant current feedback path. With this circuit self-oscillations are maintained by virtue of the fact that the current fed back exceeds the required input current. This is to be contrasted with the negative grid vacuum tube art in which, at low frequencies, it is not feasible to operate with the grid as the common electrode and to couple the anode back to the cathode directly by way of a series resonant feedback path, since the output current from the plate does not exceed the required input current to the cathode. For successful operation of such a vacuum tube oscillator, it is necessary to insert also in its feedback path an impedance-converting transformer or network which will increase the current fed back to the cathode. To avoid this added complexity, it is generally preferable to employ the cathode as a common electrode and to couple the anode as output electrode to the grid as input electrode by way of a phase reversing anti-resonant path, as in the case of the well-known Hartley and Colpitts oscillator circuits.

Because of these differences, transistor circuits are less restricted than are vacuum tube circuits. Any one of the three principal electrodes may be the grounded or common one and either voltage feedback or current feedback may be employed at will.

Another important distinction between the vacuum tube triode on the one hand and the transistor on the other is that the mobility of the transported mobile charges within the body of the semiconductor material is considerably less than the speed with which electrons travel from the cathode of a vacuum tube to its anode. Therefore, despite the small separation between the emitter and the collector, transit time effects begin to be noticeable at lower frequencies in the transistor than in the vacuum tube. In particular, it has been found that the upper limit of transistor oscillator operation occurs at from 5 to 15 megacycles per second, depending on the electrode spacing, the internal electrostatic field strength, etc.

The present invention takes advantage of the circuit flexibility of the transistor in order to overcome the frequency limitations imposed by the low speeds of its mobile charges. It provides compensation in the external circuit for transit angles within the transistor, in order that the sum of the phase angles in the various parts of the feedback loop shall be precisely an integral multiple of 360 degrees, as is required for self-oscillation, at a frequency very close to that of true resonance of the frequency-determining resonant elements. In its broadest aspects the invention provides for the inclusion, at a suitable point of the feedback loop, of a phase shifter or delay device which is adjusted to introduce in the feedback path a phase angle which is the complement of the transistor phase angle and so to modify the phase relations in the feedback path to just the extent necessary to compensate for the departure of the transit angle within the transistor itself from its low frequency value.

The invention will be fully apprehended from the following detailed description of preferred embodiments thereof, taken in connection with the appended drawings in which.

Figure 1:
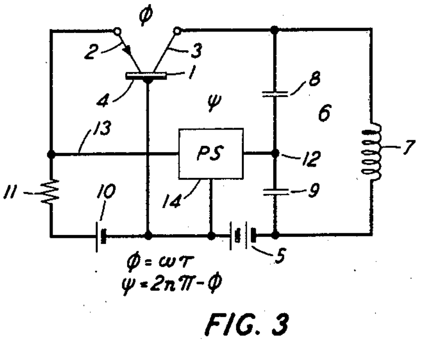
Fig. 1 is a schematic circuit diagram of an oscillator comprising a grounded base transistor and an external network of the Colpitts type with the addition of a phase shifter to compensate for internal transistor transit angles.

Referring now to the drawings, Fig. 1 shows a transistor comprising a block 1 of semiconductor material such as high back voltage germanium prepared for example as described in an article by John Bardeen and W. H. Brattain published in the Physical Review for July 15, 1948, volume 74, page 230, and having an emitter electrode 2, a collector electrode 3 and a base electrode 4. In series between the base and the collector are connected a source of direct current such as a battery 5 and a parallel tuned or antiresonant tank circuit 6 comprising a coil 7 in parallel with two condensers 8, 9. In series between the base and the emitter are connected a direct current source such as a battery 10 and a resistor 11. The polarities and voltages of the direct current sources are so chosen that the emitter operates in the forward or low impedance direction while the collector operates in the reverse or high impedance direction. In particular, for a transistor of N-type germanium as explained in the Bardeen-Brattain patent application to which reference has been made above, the emitter may have a mean potential of the order of 0.5 volt positive and the collector may have a mean potential of the order of 40 volts negative, both being measured with respect to the base electrode. With a transistor of P-type material, the polarities of the sources 5, 10 are to be reversed.

A feedback path is provided from the common terminal 12 of the two tuning condensers to the emitter 2 by way of a conductor 13 and, in accordance with the invention, a phase shifting device 14 is included in this path.

Even without the inclusion of the phase shifter 14, self-oscillations at moderate frequencies can be secured with this system, being sustained by a feedback of a part of the voltage which appears across the antiresonant tank circuit 6 to the emitter electrode 2, the biasing resistor 11 being made large enough not to constitute an excessive load to this feedback voltage. At the frequency to which the tank circuit 6 is resonant, the voltage at the common terminal 12 of the tuning condensers is in phase with the output voltage of the collector 3. Therefore, when the collector output voltage is in phase with the emitter input voltage, the fundamental phase requirement for self-oscillation, namely, that the full phase shift around the whole feedback loop shall be $2n\pi$ radians, where $n$ is an integer, is met without the addition of the phase shifter 14. Now the collector voltage of a transistor, apart from transit time effects, is in phase with its emitter voltage. Therefore, with a transitor of grounded bsae configuration as in Fig. 1, in which the emitter is the input electrode, self-oscillations can be maintained at substantially the resonant frequency of the tank circuit; but these self-oscillations are restricted to values of this resonant frequency at which transit time effects within the transistor play no significant part. With transistors of standard electrode spacings, internal field strengths, and like characteristics, transit time effects are insignificant up to frequencies of 5 to 15 megacycles per second. At higher frequencies transit time effects within the transistor itself are so great that feedback to the emitter of a fractional part of the collector output voltage without change of phase results in the application to the emitter of a voltage which is of a wrong phase to sustain self-oscillations.

When, however, the phase shifter 14 is included in the feedback path as shown, and is adjusted to introduce into the feedback path a phase angle which is the complement of the entire phase angle within the transistor, then this frequency limitation is removed and oscillations may take place at much higher frequencies.

The basic phase requirement for sustained self-oscillation may be written $$\varphi+\psi=2n\pi$$

where $\varphi$ is the phase angle contributed by the transistor and $\psi$ is the phase angle contributed by the external network. The grounded base configuration introduces no phase reversal so that the transistor phase angle consists wholly of transit angle, which at low frequencies is negligible; i. e., $$\varphi=\omega\tau$$

where $\tau$ is the transit time of the mobile current-carrying charges through the transistor, it being recognized that there is some dispersion in this quantity among the various carriers, and $$f=\frac{\omega}{2\pi}$$

is the frequency. These relations are indicated on the figure.

Figure 2:
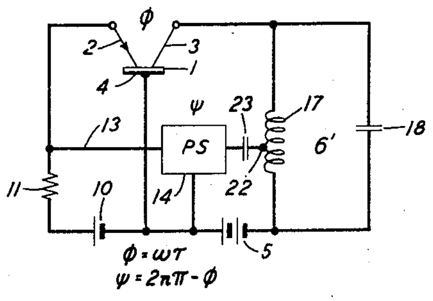
Fig. 2 is a circuit diagram showing a modification of Fig. 1 in which the external network is of the Hartley type.

Fig. 2 shows a system similar to that of Fig. 1 and similar elements are designated by like reference characters. Here, however, the external tuned tank circuit 6′ is of the Hartley variety, i. e., it comprises a condenser 18 in shunt with tapped inductance coil 17. As before, the transistor is connected in a circuit of grounded base configuration, suitable operating biases are supplied by batteries 5, 10 and the feedback voltage, derived as a fractional part of the collector output voltage, is applied to the emitter 2 and supported by a sufficiently large resistor 11. Here, however, the fractional part of the collector output voltage is obtained from a tap 22 on the tuning coil 17 and a blocking condenser 23 is included to prevent the application of the voltage of the collector bias battery 5 to the emitter 2. As before, a phase shifter 14 is included in the feedback path, and it is to be adjusted so that it introduces in the feedback path a phase angle which is complementary to the entire phase angle within the transistor itself.

Fig. 3 is again similar to Fig. 1 and similar elements are again designated by like reference characters. As in Fig. 1 the external frequency-controlling circuit 6 is of the Colpitts configuration, but here the transistor is connected in the grounded emitter circuit and the feedback path runs from the common terminal 12 of the tuning condensers to the base electrode 4. This circuit configuration, as is well known, is characterized by a phase reversal between a signal applied to the base electrode 4 and the collector output signal, just as in the case of a negative grid triode of the grounded cathode variety. This is indicated by the legend which states $$\varphi=\pi+\varpi\tau$$

Thus, even at low frequencies, a phase shifter 14 is required in the feedback path 13; and at these low frequencies, at which there is no transit angle within the transistor but merely the phase reversal above referred to, the phase shifter is to be adjusted to provide a compensating phase shift of 180 degrees. As the frequency of oscillation is increased to the point at which transit time effects come into play, the total phase lag between the voltage applied to the base regarded as an input signal and the collector voltage as an output signal becomes more than 180 degrees, for example 225 degrees; in which case, in order that the self-oscillations may be sustained, the phase shifter may be readjusted to provide a compensating phase shift, of say, 135 degrees, so that the total phase shift around the feedback loop remains 360 degrees as before.

Figure 3:
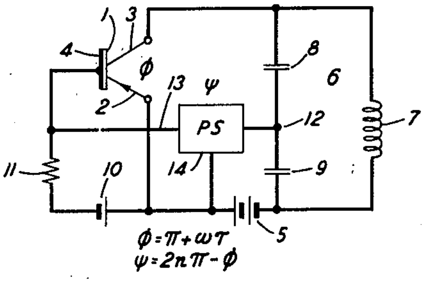
Fig. 3 is a modification of Fig. 1 in which the transistor is of the grounded emitter configuration.
Figure 4:
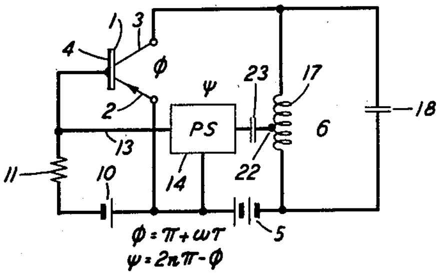
Fig. 4 is a modification of Fig. 2 in which the transistor is of the grounded emitter configuration.

Fig. 4 is a schematic circuit diagram of a system which bears the same relation to Fig. 3 as does Fig. 2 to Fig. 1. The transistor circuit is of the grounded emitter configuration and the external network, including the tank circuit 6′, is of the Hartley variety. As with Fig. 2, the feedback path is taken from the tap 22 on the tuning coil 17 through a blocking condenser 23 and a phase shifter 14. The phase relations for oscillations are the same as those of Fig. 3.

Figure 5:
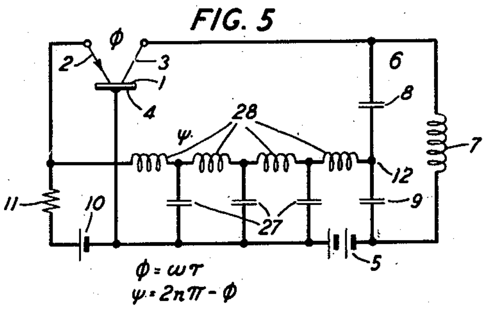
Fig. 5 is a modification of Fig. 1 including a phase-shifting network of series inductances and shunt condensers.

Fig. 5 shows a modification in which the phase shifter 14 of Fig. 1 now takes the form of a number of sections, each of which comprises a shunt condenser 27 and a series inductance coil 28. Such a combination delivers to the emitter electrode 2 a delayed version of the voltage which appears at the common terminal 12 of the tuning condensers 8, 9. With a sufficient number of sections, this delay may be made equal to 360 degrees, and in such case it balances the zero phase shift which characterizes the grounded base transistor at low frequencies. As the frequency is progressively increased the phase shift of the delay network should be progressively reduced in order that the basic requirement of a full 360 degrees phase shift around the loop remain satisfied.

Figure 6:
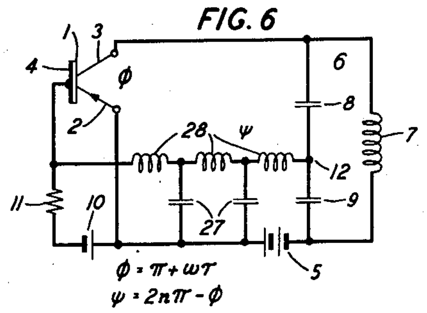
Fig. 6 is a modification of Fig. 5 in which the transistor is of the grounded emitter configuration.

For frequencies at which the transit angle within the transistor is noticeable but not large, for example 10 degrees, the configuration of Fig. 5 requires a phase shift in the delay network of 350 degrees. Economy of apparatus results, therefore, from turning to a transistor circuit of the grounded emitter configuration, as illustrated in Fig. 6 which is otherwise the same as Fig. 5. As explained above, transistor circuits of the grounded emitter configuration are characterized by a phase reversal between base voltage and collector voltage even at low frequencies. For the case under consideration, therefore, in which the transit angle within the transistor is 10 degrees, the collector output voltage lags the base input voltage by 190 degrees. Therefore, to maintain self-oscillations, the delay network 14 need supply a compensating phase lag of only 170 degrees. This evidently requires fewer sections of the delay network than are required with the grounded base transistor of Fig. 5.

Figure 7:
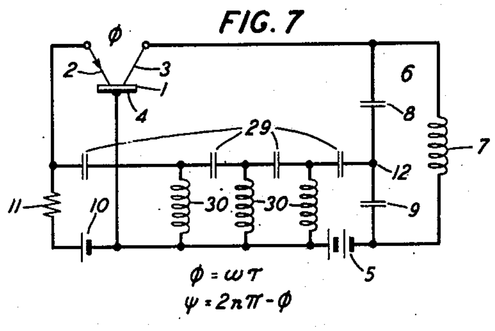
Fig. 7 is a modification of Fig. 5 including a phase-shifting network of series condensers and shunt inductances.

Fig. 7 shows an alternative to Fig. 5 in which, again, the transistor circuit is of the grounded base configuration and the frequency-controlling network 6 is of the Colpitts variety. Here, however, the phase shifting network leading from the common terminal 12 of the tuning condensers 8, 9 to the emitter 2 comprises a number of stages in each of which a condenser 29 is connected in series and a coil 30 in shunt.

Such a network is a form of high-pass filter, and affords leading, or negative, phase shift for frequencies within its normal "pass" or transmission band. The network should be designed to include the desired frequency of oscillation in this band, and to provide a negative phase shift numerically equal to the transit angle of the transistor. For the case considered above in which this transit angle was 10 degrees, the network would be required to supply a compensating shift of only minus 10 degrees; hence this design would be still more economical of sections than that of Fig. 6.

Figure 8:
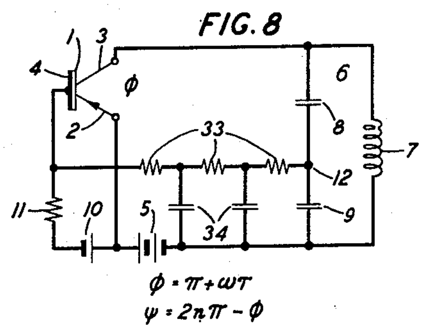
Fig. 8 is a modification of Fig. 6 including a phase-shifting network of series resistors and shunt condensers.

Fig. 8 shows a variant in which the delay network comprises a number of series resistors 33 and shunt condensers 34. Such a network, of course, contributes considerable voltage loss, so that oscillations cannot be sustained unless the transistor itself provides more than enough voltage gain to compensate this loss. However, when this is the case, the network may be designed according to known methods to introduce a phase shift, between the common terminal 12 of the tuning condensers 8, 9 and the electrode to which the feedback voltage is applied, which is just sufficient to compensate for the phase shift within the transistor itself. In the example shown, the transistor circuit is of the grounded emitter configuration and therefore the compensation provided by the network is for the phase reversal which takes place at low frequencies as well as for the further progressive increase of phase due to transit time effects which come into play as frequency increases. The resistor-condenser network can, however, if desired be employed in connection with a transistor circuit of the grounded base configuration in which the compensation is merely for the transit angle.

Figure 9:
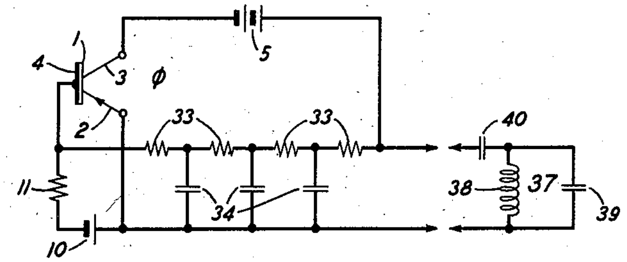
Fig. 9 is a modification of Fig. 8 in which the frequency is entirely controlled by a network of series resistors and shunt condensers.

As in the case of the so-called phase-shift vacuum tube oscillator, in which inductive tuning elements are dispensed with and the frequency of oscillation is controlled solely by virtue of the adjustment of the phase of the voltage fed back from output to input, so the tuned tank circuit of Fig. 8 may be omitted. Such omission gives rise to a circuit configuration as shown in Fig. 9, wherein a tuned reactive circuit 37 comprising a tuning coil 38 and condenser 39 is shown as connectable to but disconnected from the terminals of the phase shifting network. A blocking condenser 40 is included in series with the tuning coil 38 to prevent application of collector bias voltage to the emitter.

Figure 10:
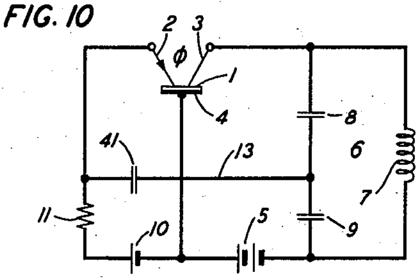
Fig. 10 is a modification of Fig. 1 in which the phase shifter is simply a condenser in series with the resistive emitter impedance of the transistor.

Fig. 10 illustrates a particularly simple form of the invention, in which, with a transistor circuit of the grounded base configuration and an external tuning network 6 of the Colpitts variety, a leading phase shift sufficient to compensate for transit time effects within the transistor is achieved by a single condenser 41 of suitable value in series with the feedback conductor 13 to the emitter. This simple arrangement can be used to compensate for transit angles up to approximately 90 degrees, the three condensers 8, 9 and 41 being so proportioned in relation to other impedances of the circuit as to give (1) the desired frequency of oscillation (2) the required compensating phase angle, and (3) the requisite amount of voltage at the emitter to sustain oscillations. In the limiting case of zero transit angle, condenser 41 becomes very large, and may well be replaced by a direct connection, the configuration then being merely that of a Colpitts oscillator. In the opposite extreme case of a transit angle approaching 90 degrees, condenser 8 becomes large, and hence replaceable by a direct connection, and condenser 41 is small, admitting just sufficient oscillatory current to the emitter to provide the amplitude of emitter voltage necessary for sustained oscillation. Passage of this current through the small condenser 41 into the low resistive impedance of the emitter then affords the aforesaid leading phase angle of nearly 90 degrees.

As an example of the actual performance of a circuit arrangement of the latter character, an oscillator has been constructed utilizing a transistor of which the emitter resistance at low frequencies was 400 ohms, the collector resistance 20,000 ohms, the base resistance 100 ohms and the mutual impedance 40,000 ohms. It was first connected as an oscillator in a conventional Colpitts circuit utilizing a resistor of 10,000 ohms to supply bias to the emitter. It was possible by reducing the magnitude of the tuning coil (to 1.9 microhenries) and tuning condenser (to 37 micromicrofarads) to generate oscillations as high as 17 megacycles per second, but no higher, and this while having due regard to impedance matching considerations. When, however, in accordance with the present invention, the full output voltage as it appeared across the tank circuit was applied by way of a feedback condenser of approximately 1 micromicrofarad capacitance to the emitter, it immediately became possible to reduce the magnitudes of the tuning coil and condenser still further without putting a stop to the self-oscillations. In this manner it was possible to generate oscillations having a frequency of 40 megacycles, thus illustrating the advantages of the invention.

Figure 11:
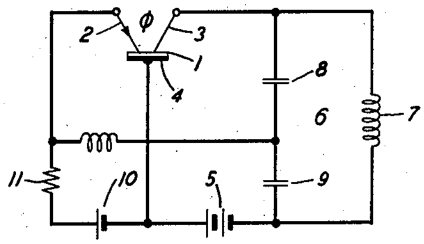
Fig. 11 is a modification of Fig. 1 in which the phase shifter consists of an inductance coil in series with the resistive emitter impedance.

Fig. 11 shows a variant of Fig. 10 in which the phase angle compensation is carried out by the application of a feedback voltage derived from the collector to the emitter, but this time by way of a series inductance coil 42. Such an arrangement introduces a phase lag which can be given any value up to approximately 90 degrees, and so operates to compensate in the manner hereinbefore described for a transit angle internal to the transistor itself between 270 and 360 degrees. The circuit of Fig. 11 is thus capable of operation at still higher frequencies than is the arrangement of Fig. 10.

Figure 12:
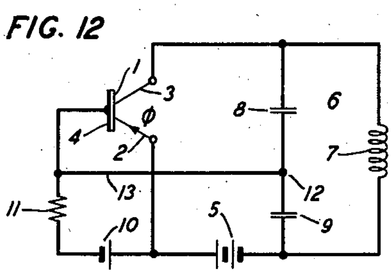
Fig. 12 shows an oscillator comprising a transistor of the grounded emitter configuration and an external circuit of inverted Colpitts form.

Fig. 12 shows a modification which is advantageous in the range of frequencies for which the internal transit angle is approximately 180 degrees, i. e., in a situation intermediate between that of Fig. 10 and that of Fig. 11. Use of the grounded emitter circuit for the transistor gives rise to a phase reversal at low frequencies. When, at high frequencies, a transit angle of 180 degrees is added, the collector voltage is once more in phase with the base voltage so that the feedback path from the common terminal 12 of the tuning condensers 8, 9 to the emitter 2 may be a simple conductor 13 as shown.

Figure 13:
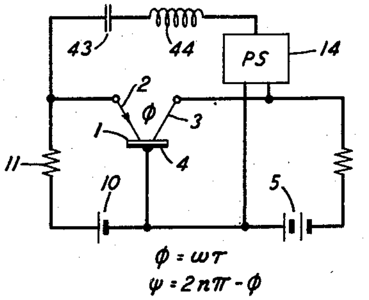
Fig. 13 shows an oscillator employing current feedback through series-resonant tuning elements, and having a phase shifter associated with the collector of the transistor.

The invention is equally applicable to oscillators which operate by virtue of current feedback, provided a transistor characterized by current amplification is employed. Thus Fig. 13 shows a high frequency transistor oscillator comprising a transistor of grounded base configuration in which self-oscillations are maintained by the feedback of a fraction of the collector output current to the emitter by way of a series resonant circuit comprising a condenser 43 and an inductance coil 44 as described in the aforementioned application of R. L. Hanson. At low frequencies at which the collector output current is in phase with the emitter current, this network oscillates at the frequency to which the resonant circuit is tuned. However, at higher frequencies at which transit time effects within the transistor come into play, the collector output current lags behind the emitter input current. In accordance with the present invention this lag may be compensated by the interposition of a phase shifting device 14 which introduces the necessary compensating phase angle.

Figure 14:
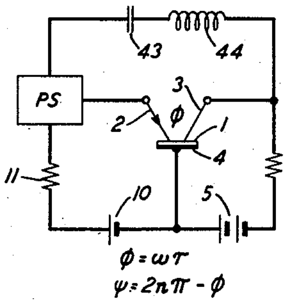
Fig. 14 is a variant of Fig. 13 having the phase shifter associated with the emitter.

Fig. 14 shows a variant of Fig. 13 in which the phase shifting device 14 is associated with the emitter electrode 2.

Figure 15:
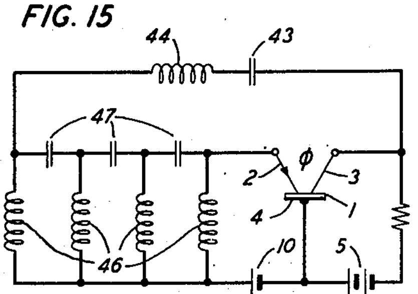
Fig. 15 is a specific form of Fig. 14 in which the phase shifter comprises a network of series inductances and shunt condensers.

Fig. 15 shows a specific form which the phase shifter of Fig. 14 may take, e. g., a delay network comprising a number of sections each having shunt inductance 46 and series capacitance 47. Such a network introduces leading phase shift but its phase does not depend sensitively upon frequency. Therefore, for purposes of frequency stabilization, the series resonant circuit of Fig. 14 is employed as well. The impedance of this circuit is low and resistive at the frequency to which it is tuned and therefore at this frequency the faction of the current fed back to the emitter through the phase shifting network has its greatest magnitude and a phase angle equal to that provided by the network alone; while at frequencies off resonance a lesser fraction of the collector current is fed back, with greater or reduced phase angle. Thus the frequency of self-oscillation of the network as a whole is the frequency to which the series resonant circuit is tuned.

The various tuning circuits, the various phase shifting networks and the various transistor circuits shown may be combined in various ways to carry out the principles of the invention and modifications will occur to those skilled in the art.

What is claimed is:

1. A generator of oscillations of frequencies at which mobile charge transit time effects play a controlling part which comprises a transistor having a body of semiconductive material, a base electrode, an emitter electrode and a collector electrode engaging said body, one of said electrodes serving as an input electrode and another of said electrodes serving as an output electrode, said transistor being adapted to deliver, by way of its output electrode, an output signal which is a delayed, amplified replica of a signal applied to its input electrode, an external network interconnecting said electrodes, said network including a path by way of which at least a part of said output signal is fed back to said input electrode, said path including an element for controlling the phase of said feedback signal, thereby to compensate for the delay through the transistor.

2. A generator of oscillations of frequencies at which mobile charge transit time effects play a controlling part which comprises a transistor having a body of semiconductive material, a base electrode, an emitter electrode and a collector electrode engaging said body, said transistor being adapted to deliver, by way of its collector electrode, an output signal which is a delayed, amplified replica of a signal applied to its emitter electrode, an external network interconnecting said electrodes, said network including a path by way of which at least a part of said output signal is fed back to said emitter electrode, said path including an element for controlling the phase of said feed-back signal, thereby to compensate for the delay through the transistor.

3. A generator of oscillations of frequencies at which mobile charge transit time effects play a controlling part which comprises a transistor having a body of semiconductive material, a base electrode, an emitter electrode and a collector electrode engaging said body, said transistor being adapted to deliver, by way of its collector electrode, an output signal which is a delayed, amplified replica of a signal applied to its base electrode, an external network interconnecting said electrodes, said network including a path by way of which at least a part of said output signal is fed back to said base electrode, said path including an element for controlling the phase of said feedback signal, thereby to compensate for the delay through the transistor.

4. A generator of oscillations of frequencies at which mobile charge transit time effects play a controlling part which comprises a transistor having a body of semiconductive material, a base electrode, an emitter electrode and a collector electrode engaging said body, one of said electrodes serving as an input electrode and another of said electrodes serving as an output electrode, said transistor being adapted to deliver, by way of its output electrode, an output signal which is a delayed, amplified replica of a signal applied to its input electrode, a frequency-determining tank circuit connected to said output electrode, and a path by way of which at least a part of the voltage developed across said tank circuit is fed back to said input electrode, said path including an element for controlling the phase of said feedback signal, thereby to compensate for the delay through the transistor.

5. A generator of oscillations of frequencies at which mobile charge transit time effects play a controlling part which comprises a transistor having a body of semiconductive material, a base electrode, an emitter electrode and a collector electrode engaging said body, one of said electrodes serving as an input electrode and another of said electrodes serving as an output electrode, said transistor being adapted to deliver, by way of its output electrode, an output signal which is a delayed, amplified replica of a signal applied to its input electrode, an external network interconnecting said electrodes, said network including a path by way of which at least a part of said output signal is fed back to said emitter electrode, said path including a number of similar sections, each including shunt capacitance and series non-capacitive impedance, for controlling the phase of said feedback signal, thereby to compensate for the delay through the transistor.

6. A generator of oscillations of frequencies at which mobile charge transit time effects play a controlling part which comprises a transistor having a body of semiconductive material, a base electrode, an emitter electrode and a collector electrode engaging said body, said transistor being adapted to deliver, by way of its collector electrode, an output signal which is an amplified replica of a signal applied to its emitter electrode but lagging in phase by an angle between zero and ninety degrees, an antiresonant reactive network connected to the collector, a feedback conductor interconnecting a terminal of said network with the emitter, and a condenser included in said feedback conductor, whereby the phase of a voltage fed back externally from the collector to the emitter is shifted in a sense to compensate for the delay internal to the transistor.

7. A generator of oscillations of frequencies at which mobile charge transit time effects play a controlling part which comprises a transistor having a body of semiconductive material, a base electrode, an emitter electrode and a collector electrode engaging said body, said transistor being adapted to deliver, by way of its collector electrode, an output signal which is an amplified replica of a signal applied to its emitter electrode but lagging in phase by an angle between 270 and 360 degrees, an antiresonant reactive network connected to the collector, a feedback conductor interconnecting a terminal of said network with the emitter, and a condenser included in said feedback conductor, whereby the phase of a voltage fed back externally from the collector to the emitter is shifted in a sense to compensate for the delay internal to the transistor.

8. A generator of oscillations of frequencies at which mobile charge transit time effects play a controlling part which comprises a transistor having a body of semiconductive material, a base electrode, an emitter electrode and a collector electrode engaging said body, said transistor being adapted to deliver, by way of its collector electrode, an output signal which is a delayed, amplified replica of a signal applied to its emitter electrode, a current feedback path coupling said collector to said emitter, a series-resonant circuit included in said path for accentuating current feedback at a desired frequency, and a phase-shifting device included in said feedback path for compensating for phase delays through the transistor at said frequency.

9. A generator of high frequency oscillations which comprises a transistor amplifier having an input electrode and an output electrode, said transistor being characterized, at high frequencies, by an internal mobile charge transit angle, a feedback path connecting the output electrode to the input electrode, and a phase shifter included in said path for compensating for said internal transit angle.

ALOIS J. RACK.

REFERENCES CITED

The following references are of record in the file of this patent:

UNITED STATES PATENTS

| Number | Name | Date |
|---|---|---|
| 2,073,117 | Parkin | Mar. 9, 1937 |
| 2,163,403 | Meacham | June 20, 1939 |
| 2,305,262 | Lange | Dec. 15, 1942 |
| 2,472,598 | Loughlin | June 7, 1949 |